United States Patent [19]

Tigelaar et al.

[11] Patent Number: 4,931,411
[45] Date of Patent: Jun. 5, 1990

[54] INTEGRATED CIRCUIT PROCESS WITH TiN-GATE TRANSISTOR

[75] Inventors: Howard L. Tigelaar, Allen; Roger A. Haken, Dallas; Thomas C. Holloway, Dallas; Robert Groover, III, Dallas, all of Tex.

[73] Assignee: Texas Instruments Incorporated, Dallas, Tex.

[21] Appl. No.: 287,808

[22] Filed: Dec. 20, 1988

Related U.S. Application Data

[62] Division of Ser. No. 938,699, Dec. 5, 1985, Pat. No. 4,814,854.

[51] Int. Cl.⁵ .......................................... H01L 21/283
[52] U.S. Cl. .................................. 437/192; 437/200; 437/201; 437/41; 437/47; 437/52; 437/60; 437/59; 437/56; 148/DIG. 147; 148/DIG. 113
[58] Field of Search ..................... 437/41, 47, 51, 54, 437/59, 60, 192, 200, 201, 52, 56, 57, 58; 357/42, 23.5; 148/DIG. 147, DIG. 113

[56] References Cited

U.S. PATENT DOCUMENTS 4,570,328 2/1986 Price et al. ............... 148/DIG. 147
4,635,347 1/1987 Lien et al. ............................ 437/41
4,772,571 9/1988 Scovell et al. ...................... 437/192
4,784,973 11/1988 Stevens et al. ..................... 437/200
4,811,078 3/1989 Tigelaar et al. ................... 357/23.5
4,814,854 3/1989 Tigelaar et al. ...................... 357/67

OTHER PUBLICATIONS

Wittmer, M. et al., "Applications of TiN Thin Films in Silicon Device Technology", Thin Solid Films, 93 (1982), pp. 397-405.

Primary Examiner—Brian E. Hearn
Assistant Examiner—T. N. Quach
Attorney, Agent, or Firm—Rodney M. Anderson; Melvin Sharp

[57] ABSTRACT

Disclosed is an integrated circuit process which includes forming two types of active devices: a first set of IGFETs has silicide gates, and the second set has TiN gates. The same TiN thin film layer also provides local interconnect. Optionally the TiN-gate devices may be used for high-voltage devices and the silicide-gate devices used for logic devices. The TiN gates in the second set of transistors and the TiN interconnect are formed by providing a thin film insulator pattern, depositing a titanium layer overall, heating the titanium in a nitrogen bearing atmosphere, and subsequently etching the titanium nitride obtained.

17 Claims, 3 Drawing Sheets

INTEGRATED CIRCUIT PROCESS WITH TIN-GATE TRANSISTOR

CROSS-REFERENCE TO RELATED APPLICATIONS

This is a division of application Ser. No. 938,699, filed 12-5, 1985, now U.S. Pat. No. 4,814,854.

The following applications, filed simultaneously with the present application, describe related subject matter: Ser. No. 938,654, filed Dec. 5, 1986, now U.S. Pat. No. 4,811,078, entitled Integrated Circuit Device and Process with TiN Capacitors; and Ser. No. 938,653, filed Dec. 5, 1986, now U.S. Pat. No. 4,811,076, entitled Device and Process with Doubled Capacitors; and Ser. No. 938,486, filed Dec. 5, 1986, pending entitled Single-Polysilicon DRAM Device and Process.

The present invention is a continuation-in-part of Ser. No. 837,611, filed 03/07/86, now abandoned, and of Ser. No. 729,318, filed 05/01/85, now U.S. Pat. No. 4,821,085.

BACKGROUND AND SUMMARY OF THE INVENTION

The present invention relates to integrated circuits and to methods of manufacturing them.

In a new class of integrated circuit fabrication processes taught by the grandparent application (Ser. No. 729,318, filed 05/01/85, a very novel local interconnect technology was set forth, which resulted in very conveniently produced titanium nitride local interconnect line. These lines can be routed to interconnect p+ substrate regions, n+ substrate regions, and polysilicon in any pattern desired, while also permitting self-aligned silicidation to occur to clad surfaces of exposed silicon substrate areas and also od exposed polysilicon lines with silicide, to improve their conductivity.

In general, the present invention permits a process using only one polysilicon level to achieve many of the advantages which otherwise would require two levels of polysilicon. Similarly, another class of embodiments of the present invention permit a process using only two polysilicon levels to achieve many of the advantages which otherwise would require three levels of polysilicon. EEPROMs are only one example of this capability, which, again, can be adapted to a tremendous variety of other devices. Yet another class of embodiments of the present invention permit a process using only two polysilicon levels to achieve many of the advantages which otherwise would require four levels of polysilicon. by using two silicidation steps and two interlevel dielectric deposition and patterning sequences in a two-poly process, two independent layers of TiN can be made available for capaciitor plates, local interconnects, etc.

The present invention teaches that, as a particularly useful development of the technology taught in the grandparent application, two very different types of transistors can be built on a single integrated circuit using only one level of polysilicon. A patterned dielectric covers some areas of the polysilicon, so that the titanium metal in these areas does not form silicides during the reaction process, but will be converted to a thin film of titanium nitride, which is a very convenient conductor. However, where underlying silicon areas (either of substrate monocrystalline silicon or of polycrystalline silicon) were not protected by this thin dielectric from the deposited titanium, the nitrogen-atmosphere reaction step will form titanium silicide at all such locations. Wherever the titanium metal runs over field oxide or over other non-silicon materials, it will form titanium nitride. This titanium nitride will already be in ohmic contact with any area of exposed silicon it runs over. By patterning this titanium nitride layer, the equivalent of a second polysilicon layer with full buried contact capability is achieved. That is, this layer can make direct contact to n+ or p+ source/-drain portions of the substrate wherever (in the periphery) is desired. In particular, portions of this titanium nitride layer can be used for the gates of transistors.

Note that, as one consequence of the preferred process flow, the gate oxide thicknesses of two types of transistors can be optimized independently to provide, for example, both high-voltage and low-voltage transistors on a single chip. For example, the TiN-gate devices can be used to control the high voltages needed for programmation of floating-gate memory cells (or, in some systems, to drive high-voltage output lines). The idea of TiN-gate MOSFETs is believed not to be novel of itself (see, e.g. U.S. Pat. No. 4,605.947 to Price et al.); but this class of embodiments of the present invention is uniquely advantageous in providing transistors with independently optimizable characteristics as the result of a very simple process.

One specific use of the two types of transistors is to provide high-voltage transistors on-chip. There are many integrated circuit appliations (such as display drivers, small motor controllers, and line drivers) where it is desirable to be able to implement complex logic functions and also control a high-voltage output. This capability is also useful in EEPROM structures, where the programmation voltages may be as high as 20 Volts. In conventional process, many extra steps are usually added to achieve high-voltage capability without degrading the speed of the logic (low-voltage) circuits, and some compromises which reduce speed must often be accepted.

In particular, one of the problems in adapting high-voltage devices is into a low-voltage process is caused by the danger of degradation due to hot-electron injection: the lightly-doped drain structures which will prevent this problem in the high-voltage device may introduce too much series resistance and/or consume too much area not be acceptable in the low-voltage devices.

One class of embodiments of the present invention provides a split-gate high-voltage transistor, with a TiN gate overlying polysilicon gate edge guard lines, to provide hot-electron protection for the high-voltage device without compromising the characteristics of the low-voltage devices. Both split-gate (TiN/polysilicon) high-voltage transistors and conventional optimized logic or memory devices (having gates of polysilicon clad with silicide) can be built on a single integrated circuit, using only one level of polysilicon and a small number of process steps.

Another advantageous use of the present invention is to provide such split-gate high-voltage transistors as on-chip high-voltage drivers to control the programmation voltages in an EEPROM. The present invention can also be applied to fabricate an EEPROM, i.e. an electrically erasable floating gate memory. (The term "EEPROM" is normally used for a class of floating gate memories which are programmed or deprogrammed by applying a bias which creates a large vertical electric field at the surfaces of the floating gate to induce electron tunneling into or out of the floating gate. By contrast, an EEPROM is typically programmed using channel current under high drain bias to create hot electrons, and can only be deprogrammed by exposure to ultraviolet light.)

One of the inherent tradeoffs in an EEPROM design is that the easiest way to achieve faster programmation is by use of higher programming voltages (for example, an EEPROM which is programmed at 21 Volts will program many times faster than one which is programmed at 16 Volts). However, use of higher programming voltages puts even heavier constraints on the device characteristics necessary to control the high-voltages, and these constraints may translate into increased process complexity, or degraded device characteristics for the logic devices, or both.

Drivers according to the present invention may be integrated with EEPROMs which include a TiN control gate, to provide an extremely simple EEPROM process with improved programming performance. In one class of embodiments, a process using only one level of polysilicon is used to fabricate a fully functional EEPROM including customized high-voltage driver transistors as described.

To build the EEPROM memory array, one conventional way is to include an area of extremely thin dielectric—substantially thinner than the main area of gate dielectric—under the floating gate to promote tunneling between the floating gate and the substrate. Alternatively, an additional thin film layer which underlies a portion of the floating gate can be used, preferably with surface asperities to promote tunneling, so that programmation and erasure both involve tunneling between the floating gate and another thin film layer. The present invention is readily applicable to fabrication of EEPROMs of the first type described, and may also be applied to build EEPROMs of other types, with advantageously reduced process complexity fromo that which would otherwise be required.

Thus, the present invention offers the significant advantage of simpler processing than conventional high-voltage plus logic integrated circuit fabrication methods.

Another crucial class of advantages of the present invention is that it permits high-voltage driver transistors to be readily inserted into existing VLSI logic processes (particularly CMOS processes) with relatively minor modifications. This means that designers can add additional capability of existing designs, without greatly disrupting the performance of (or requiring redesign of) the circuitry in the existing designs. For example, this means that high-voltage driver capability can be readily integrated into microprocessors, logic arrays, or "smart" memory chips. This greatly reduces the cost and difficulty of system customization for hostile environments.

In addition to these advantages, the TiN layer present can also be used for local interconnect, which provides yet further advantages.

Another adbvantageous use of the TiN layer is to provide pads at the bottom of contact holes. Since the oxide etch chemistries normally used for contact etching are somewhat selective to TiN, this layer provides some protection against overetching when the contact etch step must etch contact holes of various thicknesses. In particular, the present invention makes it easier to etch contact holes to substrate and to the polysilicon layer simultaneously. Moreover, the TiN etch stop pads can be extended from the source/drain regions (in the moats) up onto the field oxide, so that the contact hole does not have to fall within the perimeter of the source/drain, but can overlap up onto the field oxide. This means that the source/drain patterns can be drawn smaller, providing a further advantage of the invention.

yet another use of the TiN layer provided by the presently preferred embodiments of the present invention is to provide capacitors to substrate. Since the interlevel dielectric is patterned after the source/drain implants, these capacitors can be located over heavily doped diffusions, so their parasitic series resistance should not be large.

According to the present invention there is provided: An integrated circuit device comprising: a substrate: device isolation regions defining predetermined moat areas of exposed semiconducting material; a first plurality of active devices near the surface of said moat areas, said first active devices comprising insulated-gate field effect transistors iincluding portions of a first patterned thin film conductive layer as gates thereof: and a second patterned thin film conductive layer consisting predominantly of titanium nitride, some portions of said second conductive layer making ohmic contact to predetermined portions of said moats areas, and some portions of said second conductive layer overlying a relatively thin film insulator over at least some respective portions of said moat areas to define a second plurality of active devices near the surface of said moat areas, said second active devices comprising insulated-gate field effect transistors including portions of said second patterned thin film conductive layer as gates thereof, said second active devices having an oxide-equivalent thickness of the gate insulators thereof which is more than 150% of the oxide-equivalent thickness of the gate insulators of said first active devices.

According to the present invention there is also provided: A process for fabricating integrated circuits, comprising the steps of: providing a substrate having monocrystalline semiconductor portions at at least some surface portions thereof, said semiconductor consisting predominantly of silicon; providing device isolation areas in a predetermined pattern to define separate moat regions in predetermined locations of said monocrystalline semiconductor; fabricating a first plurality of insulated gate field effect transistors in predetermined locations in said moar regions, gates of said first insulated gate field effect transistors being formed by portions of a first patterned thin film conductive layer; providing a thin film insulator over at least some parts of said first patterned thin film conductive layer, and also providing a thin film insulator over predetermined locations of a second plurality of insulated gate field effect transistors in respective ones of said moat regions; depositing a metal consisting substantially of titanium overall; heating said substrate and said metal in a nitrogen-bearing atmosphere, so that said metal reacts with exposed portions of said substrate to form titanium silicides, and other portions of said metal also react with said nitrogen atmosphere to form a layer having a large fraction of titanium nitride at the surface thereof; and etching predetermined locations of said titanium nitride layer to provide local interconnection in a predetermined pattern, while also leaving portions of said titanium nitride layer in place over at least some locations of said thin film insulator over said second transistor locations to define gates of said second transistors.

BRIEF DESCRIPTION OF THE DRAWINGS

The present invention will be described with reference to the accompanying drawings, wherein.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely ilustrative of specific ways to make and use the invention, and do not delimit the scope of the invention.

Figure 5:
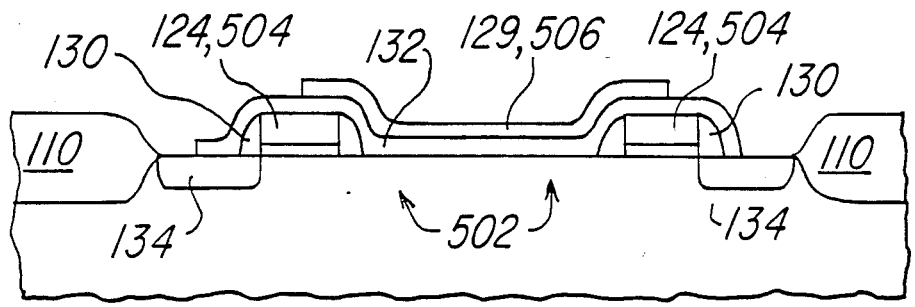
FIG. 5 shows a sample insulated gate field effect transistor, according to some embodiments of the present invention, where the gate consists predominantly of titanium nitride, and (in the example shown) a split-gate structure is used.
Figure 6:
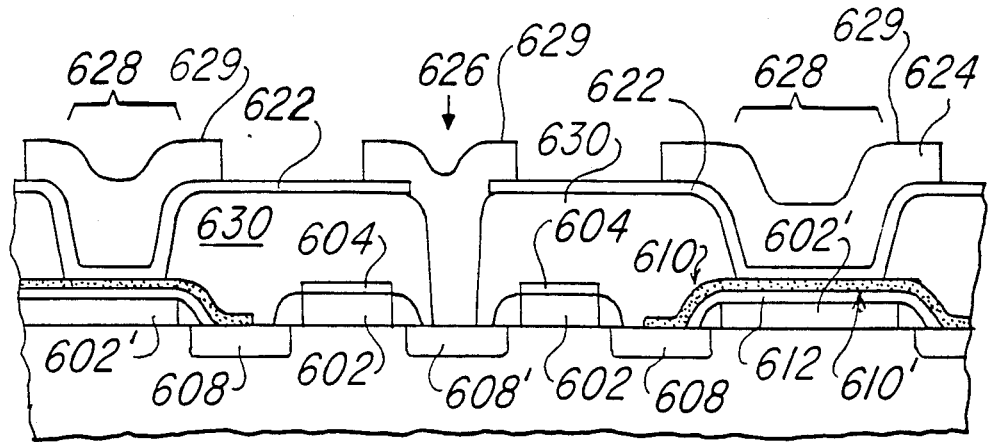
FIG. 6 shows an example of a stacked capacitor structure constructed using only one level of polysilicon.

A sample structure for using the TiN layer (or local interconnect layer) to form the gates of insulated gate field-effect transistors is shown in FIG. 5.

Fortunately, the work function of titanium nitride is close enough to that for n+ polysilicon that TiN can be used as the pass gate for an insulated gate field effect transistor having its channel in bulk silicon without having to use extreme or very unusual $V_T$-adjust dopings or back-bias conditions.

It should be noted that, if in-situ reacted titanium is used as the source of the titanium nitride, the gate dielectric for the TiN-gate IGFETs is preferably an oxide/nitride stack (like the interlevel dielectric described above) or graded composition dielectric, or else simply a nitride layer, to avoid any risk that a silicon dioxide gate dielectric would react significantly with titanium at the temperatures most preferably used for the silicidation reaction. However, oxide dielectrics may less preferably be used for these transistors, if they are thick enough.

Thus, the most preferred embodiment of this class of embodiments uses a nitride/oxide stack both for the gate dielectric of TiN-gate transistors and also for separating the TiN layer from the polysilicon layer to define floating-gate memory cells or capacitors.

Less preferably, instead of forming TiN as a reaction product, sputtering or evaporation or chemical vapor deposition may be used to deposit TiN. The lower temperatures which can be used in such variations mean that the risk of reaction with the gate oxide is avoided, especially when a stoichiometer TiN layer is deposited at temperatures below the temperature at which it reacts with $SiO_2$. Many of the advantages of process simplification and versality discussed above would be sacrified in this case; but it should be noted that this may provide a preferable way to fabricate a structure like that of (e.g.) FIG. 5.

Figure 1A:
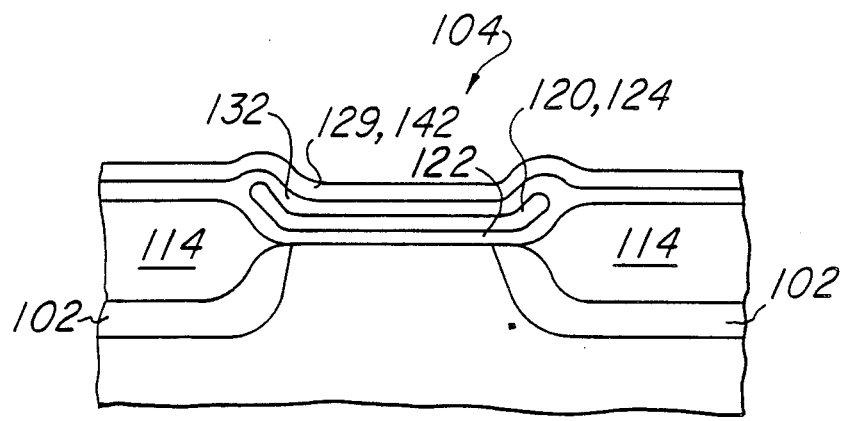
FIG. 1A shows a sample floating gate memory cell constructed using only one level of polysilicon.
Figure 3:
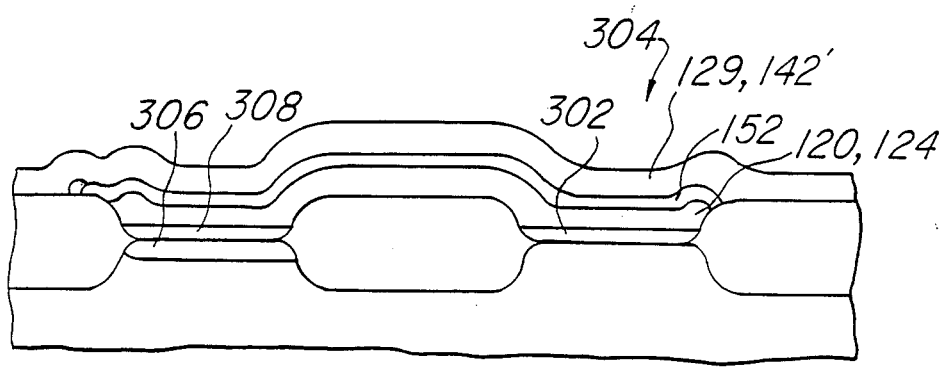
FIG. 3 shows a sample electrically erasable nonvolatile memory cell constructed using only one level of polysilicon.
Figure 4A:
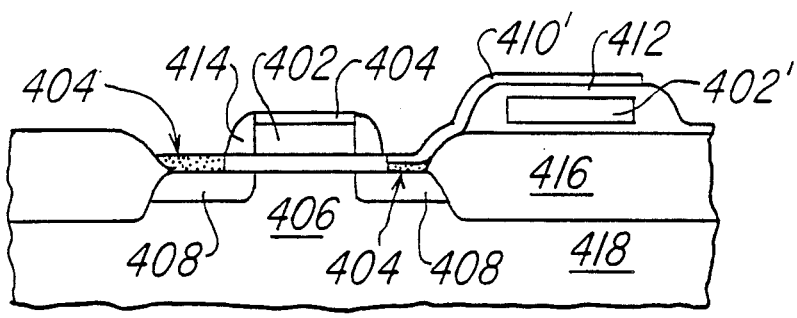
FIGS. 4A and 4B show examples of DRAM cells constructed using only one level of polysilicon.
Figure 4B:
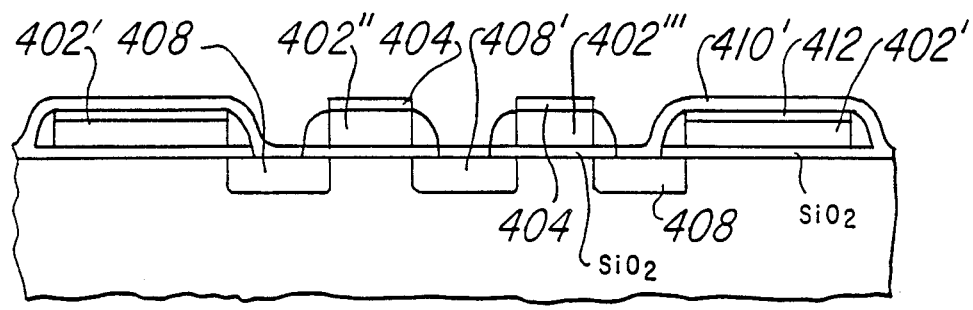

As noted, such TiN-gate devices may be used to configure high-voltage transistors (while reserving the silicon-gate transistors for low-voltage logic), or, conversely, the TiN-gate devices may be used for logic and the silicon gate devices for high voltage. A sample embodiment where TiN-gate devices are used for high-voltage devices is shown in FIG. 5. Such devices may be useful in the periphery of EEPROM arrays, to handle the extremely high voltages which are useful for programming EEPROMs. The device shown in FIG. 5 may be fabricated in the same process sequence as the low-voltage devices of FIG. 1B and the EEPROM memory cell of FIG. 3 (or the EPROM memory cell of FIG. 1A).

In the example of FIG. 5, the high-voltage transistor 502 is configured as a split-gate device. That is, two segments 504 of the first pattern conductive layer 124 (polysilicon in this example) run across the moat at either side of the gate 506 (which is formed as a portion of the local interconnect layer (second patterned thin film conductive layer) 129), and separate the edge of the gate 506 from the source/drain regions 134 (to avoid too high electric fields being induced at the source/drain boundaries by voltages applied to the gate 506). The gate dielectric under the gate 506 of this high-voltage device is provided by interlevel dielectric 132 (an oxide/nitride stack, in this example), and the gate edge barriers 504 are underlain by a thin oxide dielectric which is preferably part of the same thin film layer as that which provides the gate dielectrics of the peripheral devices shown in FIG. 1B.

The gate edge barriers 504, with their sidewall oxides 130, provide a reproducible spacing between the gate 506 and the source/drain diffusions 134. (In this example, where CMOS peripheral devices are used and source/drain counterdoping is not used, no additional masking steps are required in order to form these source/drain diffusions 134 on only one side of the gate edge barriers 504; since one or both of the source/drain implants must be masked anyway (to differentiate NMOS source/drain regions 134 from PMOS source/drain regions 136), a masked source/drain implants is used to form the source/drains of high-voltage transistor 502. However, the edge of the mask for this patterning step runs along the gate edge barriers 504, so that moderate misalignment of this mask has no effect on the $L_{eff}$ of high-voltage transistor 504). Moreover, if steps to produce lightly-doped drain structures are included in the process flow (e.g. to produce a region of intermediate doping level under the sidewall oxides 130 of the NMOS logic transistors 116), these lightly-doped drain structures will also appear under the sidewall oxides 130 of the high-voltage transistors 502, further improving immunity to hot-carrier induced degradations.

Preferably (depending on the operating voltages used in high-voltage devices 502) the gate-edge extensions 504 are merely capacitively coupled to the gate 506; the specific capacitance between overlapping portions of these two layers will be reasonably high, so that the potential of the gate-edge extensions 504 will partially track the swing of gate 506, and thus naturally provide a reduced potential near the drain edge to reduce hot-carrier effects. The price of this protection against hot-carrier effects will be some added series resistance, but this is oftan a secondary concern in high-voltage integrated devices. The over-lap of gate 506 onto approximately the middle of the gate-edge extensions 504 will provide some capacitive coupling; if closer coupling is desired (to achieve greater voltage swing on gate-edge extensions 504), a capacitor pad can be added on field oxide 110 near the high-voltage device 502. (Conversely, if it is desired to induce less voltage swing on the gate-edge extensions, they can be given additional capacitive coupling in the other direction, e.g. by extending them onto moat areas where they are not overlain by the gate.) Moreover, if even greater protection against hot carriers effects is desired (at the price of increased series resistance), the gate-edge extensions 504 can be patterned to a width which is greater than minimum geometry.

Optionally, where gate-edge extensions are used on both ends of the gate, the two gate-edge extensions may be DC-isolated from each other (although of course they will be capacitively coupled, since they are both coupled to the gate). The advantage in this is that the gate-edge extension on the drain side, being a floating node, is somewhat susceptible to charge accumulation due to hot-carrier injection over time. By decoupling the drain-side gate-edge extension from the source-side gate-edge extension, the shift in transistor characteristics due to charge injection into this floating node will be minimized.

A further optional process modification is to provide additional implants into the channel of the high-voltage devices, i.e. shallow implants for $V_T$-adjust and/or deep implants to help avoid punchthrough. These implants will preferably be performed at the same time in the process when the $V_T$-adjust implants are being done; if two masks are used for NMOS and PMOS $V_T$-adjust, the implants for the high-voltage devices will not require an additional mask step (to accomplish this, the second $V_T$-adjust masking step can be implemented as a hard-mask, although this will require additional deposition and removal steps).

Details of a sample process flow to provide the partially split polycide layer used in the present invention will now be given. The particular steps specified will provide an EPROM like that shown in FIG. 1A; adaptation of the key steps to fabrication of a structure as shown in FIG. 5 is straightforward. Routine and obvious steps, such as cleanups, bakes, ashes, and deglazes are generally not specifically detailed.

1. Tank formation: the following steps are used to define n-wells (PMOS device regions) 106 and p-wells (NMOS active device regions) 108 for the peripheral devices:
    (a) The starting material is 12–15 Ω-cm p-type epitaxial material, which is 12–15 microns thick and has (100) orientation, on a P+substrate (0.01–0.02 Ω-cm).
    (b) An oxide/nitride stack is formed and patterned, and Phosphorus is implanted (with the photoresist still in place) to form the n-wells 106.
    (c) A thick "color reversal oxide" is then grown to define the p-well pattern as (essentially) the complement of the n-well pattern, and the nitride is then stripped to expose clean bare silicon where not protected by the color reversal oxide.
    (d) Boron-11 is then implanted to form the p-wells 108, and the color reversal oxide is then stripped.
    (e) The tank implants are then activated and driven in.
2. Formation of moats (i.e. regions, surrounded by field oxide 110, where the peripheral active devices will be formed) now proceeds.
    (a) Silicon nitride is now deposited and etched in a pattern which leaves nitride in the regions where active devices will be formed (and also over the entire array of non-volatile memory transistors 104), and Boron-11 is implanted to form the channel stop 112 under the field oxide regions 110.
    (b) A 900° C. steam oxidation step is then performed to grow 9500 Å of oxide, which will form the field oxide isolation regions 110 which separate the moat regions from one another. (Note that these field oxidation regions 110 are used only in the periphery; the self-aligned thick oxides 114 which form the bitline insulator strips over buried n+regions 102 in this embodiment will be formed later.)
3. The bitline diffusions 102 will now be formed.
    (a) The buried n+ pattern is defined in photoresist, to expose the locations of the bitline diffusions 102.
    (b) A plasma etch is now used to clear the remaining nitride from the bitline diffusion locations, and Arsenic is implanted (e.g. 50 ke V, $5.0E15 cm^{-2}$) to form the bitline diffusions 102.
    (c) The implanted n+ regions are then annealed, and a self-aligned thick oxide 114 is grown, by 100 minutes in Argon at 900° C. followed by a 900° C. steam oxidation for long enough to grow 4500 Å of oxide over the buried n+ regions (about 40 minutes).
    (d) The remaining nitride is then stripped, using a 1% HF deglaze followed by hot phosphoric acid, and the pad oxide under the nitride is also stripped using a quick dip in 1% HF.
4. The gates of the peripheral devices 116 and 118, and the floating gates 120 of the floating-gate non-volatile transistors 104 in the memory array, will now be formed.
    (a) A dummy gate oxidation (anti-Kooi-effect oxidation) is now performed at 900° C. in steam, to grow 350 Å of oxide.
    (b) Photoresist is now patterned to mask the first threshold voltage adjusting implant ($V_{TA}$-adjust), and the threshold voltages of the floating-gate transistors 104 are adjusted by appropriate implantation.
    (c) The photoresist is stripped (e.g. in $H_2O_2/H_2SO_4$).
    (d) The dummy gate oxide is stripped in a 1% HF dip. (In this and other deglaze steps, the time in HF is preferably minimized to avoid excessive loss of the thick oxide over burried n+ (the bitline isolation oxide)).
    (e) A gate oxidation step is now performed, at 900° C. in steam, to form 400 Å of oxide 122.
    (f) Boron-11 is now implanted (35 ke V, $5E11 cm^{-2}$) to adjust the thresholds of NMOS devices in the periphery.
    (g) Photoresist is now patterned to expose only the channels of PMOS devices, and boron-11 is again implanted (35 ke V, 9E11 cm$^{-2}$) to adjust the thresholds of PMOS devices in the periphery.
(h) The photoresist is stripped.
(i) The first patterned thin film conductor layer 124 is now formed, by LPCVD deposition of polysilicon to a thickness of 3000 Å, and doped to 100 Ω/□ by 20 minutes in a POCl$_3$ atmosphere at 850° C.
(j) Photoresist is now patterned to define the gates 126 of NMOS devices 116 in the periphery, gates 128 of PMOS devices 118 in the periphery, and the floating gates 120 of the non-volatile transistors 104 in the memory array, and the polysilicon level is etched (using, e.g., an HCl/HBr plasma etch chemistry) accordingly. The remaining photoresist is then stripped.
(k) 2500 Å oxide is then deposited by LPCVD from a vapor containing tetraethylorthosilane, and anisotropically etched to form sidewall filaments 130 shown) of almost 2500 Å maximum thickness.
(l) An interlevel dielectric 132 is now deposited by LPCVD in a single step at 800° C.: 150 Å of oxide is followed by 250 Å of nitride.

5. Source/drain regions 134 and 136 in the periphery will now be formed.
   (a) Photoresist is patterned to expose the source/-drain regions 134 of the NMOS devices in the periphery, and As is implanted (150 keV, 5E15 cm$^{-2}$) followed by P (100 keV, 4E14 cm$^{-2}$).
   (b) Another patterned photoresist layer is now used to expose the PMOS source/drain regions 136, and boron-11 is implanted (40 keV, 3.0E15 cm$^{-2}$).
   (c) The photoresist is now stripped.
   (d) The source drain implants are annealed by a 900° C. furnace treatment (Ar for 60 minutes, then O$_2$ for 30 minutes, then Ar for 10 minutes).
   (e) The interlevel dielectric 132 is now etched away in the periphery, using a mask which covers the whole array. If capacitors are desired outside the array, the interlevel dielectric 132 is simply left in place over the first patterned thin film conductor layer 124 in those locations.
   (f) Photoresist is then stripped.

6. The TiN layer 129 will now be formed, to provide local interconnects 140 in the periphery and to form the control gates 142 of the non-volatile transistors 104 in the array.
   (a) 1000 Å of pure titanium is deposited overall.
   (b) A silicon nitride/silicon dioxide cap layer (e.g. 400 Å Si$_3$N$_4$ over 800 Å SiO$_2$) is deposited overall.
   (c) The wafer is heated (e.g. to 675° C. for 30 min) to cause TiSi$_x$ 144 to form on areas where the titanium is in contact with silicon.
   (d) The nitride/oxide cap layer is plasma etched so that is protects the conductive titanium compounds beneath it in desired locations of local interconnects 140, and also in the predetermined locations of control gates 142 in the memory array. (As discussed below, the titanium in these locations will be an oxygen-doped titanium-rich off-stoichiometric titanium nitride.) This single patterned etch step defines locations of control gates (of non-volatile memory transistors), local interconnects, and (if used) capacitors.
   (e) The unreacted titanium (and nitride/oxide filaments) are selectively stripped by wet chemical etch.
   (f) A p-type bitline isolation implant (which will be self-aligned, i.e. screened by the bitline insulator strips (thick oxide) and by the TiN wordlines) is now performed, to provide increased p-type doping to separate adjacent transistors in the same column.
   (g) Photoresist is then stripped, and the wafer is annealed (800° C., 30 min, nitrogen atmosphere) to lower the sheet resistance of the silicides 144.
   (h) A conformal oxide layer is now deposited overall, e.g. 1000 Å of TEOS oxide, to prevent outdiffusion of dopant species from the following the MLO layer into the contacts.

Figure 1B:
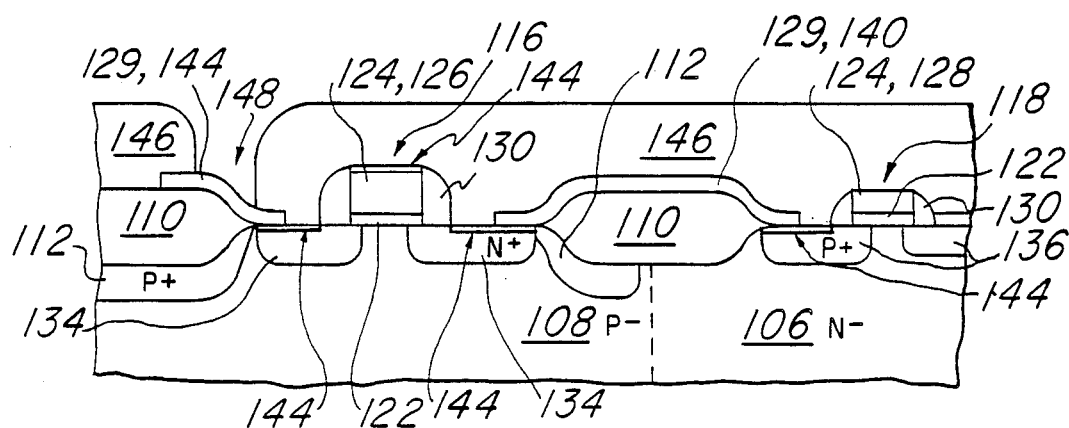
FIG. 1B shows a sample embodiment of CMOS peripheral logic-devices, which are integrated on a common chip with an array of memory cells such as that shown in FIG. 1A to provide addressing and sensing logic.

7. Contacts are now formed.
   (a) The MLO 146 is deposited: for example, a borophosphosilicate glass (BPSG) containing approximately 4.5% boron and also about 4.5% phosphorus is used.
   (b) A 900° C. furnace step (30 minutes in argon) is used to densify the BPSG 146.
   (c) Photoresist is applied and patterned to expose the locations of contact holes 148, the contact holes are etched, and the remaining resist is stripped. Note that this step too applies principally to the periphery: there are preferably no contacts in the memory array, except for occasional metal to TiN contacts used for strapping the word lines. Preferably contact pads 149 (provided by patterned portions of the second patterned thin film conductive layer (local interconnect layer) 129, which preferably comprises a large fraction of titanium nitride to advantageously provide an etch stop and diffusion barrier) are included at the bottom of contact holes 148, as shown in FIG. 1B.

8. Processing continues conventionally with metal patterning, for the peripheral devices only.
   (a) A deglaze in 1% HF is used to get good metal adhesion, and metal is then deposited by sputtering.
   (b) A dyed photoresist is deposited and patterned, the metal is plasma etched, and the resist is stripped.
   (c) The structure is heated to 450° C. in H$_2$ for 30 minutes to sinter the metal and lower its contact resistance.

9. A protective overcoat is now formed:
   (a) 4500 Å of oxynitride dielectric is deposited overall by LPCVD.
   (b) The protective overcoat is covered with a patterned photoresist and etched away to expose metal at contact pad locations, and the photoresist is stripped.

10. Processing concludes with backgrind and backside gold deposition.

Figure 1C:
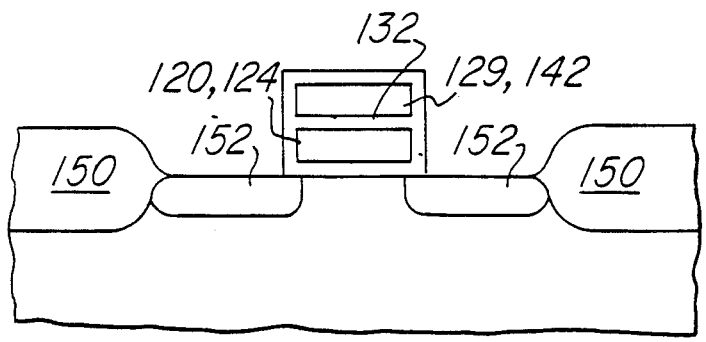
FIG. 1C shows another sample floatinf gate memory cell constructed using only one level of polysilicon.
Figure 2A:
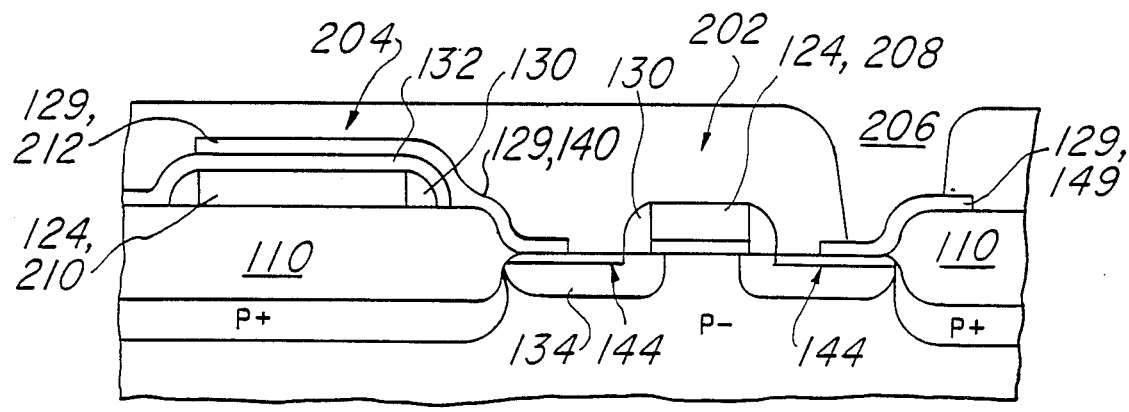
FIG. 2A shows a sample analog circuit including a capacitor having a TiN top plate and a polysilicon bottom plate.
Figure 2B:
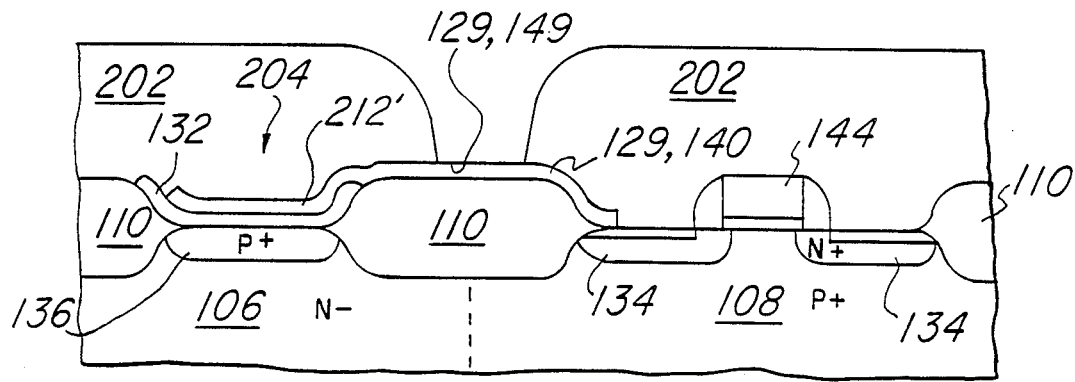
FIG. 2B shows another sample analog circuit including a capacitor having a TiN top plate and a bottom plate in heavily doped silicon substrate (doped with the source/drain implant).

This process can also be modified to produce an EPROM cell like that shown in FIG. 1C. In this case the source/drains 152 are formed within moat regions patterned in LOCOS field oxide 150 (which may optionally be the same as field oxide 110 used in the periphery), and the source/drains are self-aligned to the stack of floating gate 124 and control gate 142. The buried n+ diffusions for source and drain are not necessary in this type of EPROM.

There are three principal variations in the method for forming the second patterned conductive thin film layer (local interconnect layer) 129 after the patterned interlevel dielectric 132 is in place:

The TiN which is formed during a nitrogen-atmosphere direct-react siliciding process can be patterned and etched.

A cap can be formed over a metallic titanium layer before the anneal which effects silicidation. This is the presently preferred embodiment. The conductive material in the local interconnect lines will be non-stoichiometric TiN (titanium-rich, and with a substantial admixture of oxygen if the cap layer is an oxide), but it will work.

Less preferably, the Ti layer which is to be converted to TiN can be patterned and etched before conversion. This technique could be applied, for example, to the use of TiN as a gate level where Ti is deposited on the gate oxide, patterned, and etched. Subsequent reaction in a nitrogen containing ambient would result in TiN gate electrodes. An advantage of this class of embodiments is that titanium can be etched with very high selectivity to $SiO_2$ (more easily than TiN can). Thus, TiN local interconnect can be formed by forming Ti straps which overlap gate and moat regions, followed by heating in a nitrogen containing ambient to produce TiN connecting the moat and gate regions across the intervening oxide region and $TiN/TiSi_2$ in the regions where the straps cross silicon regions (substrate or polysilicon gates). (This would normally be done after a $TiSi_2$ cladding of the gates and moats, but this is not strictly necessary.)

TiN can be deposited, either by CVD or by sputtering. This is the least preferred method, since it does not provide the convenience of silicide-clad moats and polysilicon, but this method would still enable some of the advantages of the invention.

Additional details regarding implementation of these alternatives will now be described.

A sample process flow is as follows:
After S/D anneal, deposit pure titanium (1000 Å)
Deposit low temperature silicon nitride/silicon dioxide layer (400 Å/800 Å)
Silicide react (675° C., 30 min)
Plasma etch nitride/oxide layer
Selectively strip unreacted titanium (and nitride/oxide filaments) by wet chemical etch
Silicide anneal (800° C., 30 min)

Another sample process flow is as follows:
After S/D anneal, deposit 0.1 μm of pure titanium
Deposit low temperature (300° C.) $SiO_2$
Silicide reaction, 675° C. for 30 min in $N_2$
Unmasked plasma etch of oxide layer (using a standard fluoro-etch chemistry as commonly used for oxide/nitride etching)
Selective wet strip of Ti reaction products on oxide regions ($H_2O_2/H_2SO_4$, or $H_2O_2/NH_4OH$ with ultrasonic agitation)
Silicide anneal Another sample process flow is as follows:
After S/D anneal, deposit 0.1 μm of pure titanium
Deposit low temperature (300° C.) $SiO_2$
Silicide reaction, 700° C. for 15 sec (transient heating) in $N_2$
Unmasked plasma fluoro-etch of oxide layer
Selective wet strip of Ti reaction products on oxide regions ($H_2O_2/H_2SO_4$, or $H_2O_2/NH_4OH$ with ultrasonic agitation)
Silicide anneal The cost of this version of the process is an extra 0.1 μm plasma oxide deposition and an unmasked dry etch step. However, the benefit of eliminating the sensitivity of the process to ambient gas contamination, and therefore the improved reproducibility of the process, probably outweighs the disadvantage.

Thus, a patterned local interconnect layer can be obtained by depositing and patterning a thin hardmask before the step of reacting the titanium in a nitrogen atmosphere. For example, a 1000 Å layer of plasma oxide (i.e. silicon oxides deposited in a plasma reactor at low temperature, e.g. 300° C., to produce a fairly low density oxide) can be deposited over the titanium metal, etched to mask local interconnects in the desired pattern (using an oxide etch such as $CHF_3+C_2F_6+O_2+He$, which is selective to titanium, so that the titanium layer under the plasma oxide provides an etch stop) and left in place during the reaction which produces TiN and $TiSi_2$ compounds. There will be significant reaction between the titanium metal and the plasma oxide, so that (in one example where rapid thermal annealing was used) Rutherford Backscattering Analysis has revealed that the titanium metal under the plasma oxide layer has an oxygen to titanium atomic ratio of 0.69:1 (as compared to an oxygen to titanium atomic ratio, for titanium which lies on field oxide and is exposed to the nitrogen atmosphere during the reaction step, of around (0.25:1). This high oxygen content is not enough to destroy the metallic conduction properties of the titanium, but does impart substantial resistance to etching ($TiO_2$ is an extremely stable compound which is very difficult to etch). The metallic titanium remaining can be converted to titanium nitrides and/or silicides by a subsequent reaction step. It has been experimentally found that this process does provide a local interconnect with valuable properties including conductivity, etch stop capability, and providing a barrier to lateral diffusion, although the interconnect thus provided is not initially pure TiN, at least where rapid thermal annealing is used for the silicidation (its atomic fraction of nitrogen is much less than 1%, except possibly at the corners of the plasma oxide mask). Note that the plasma oxide mask remains in place through the TiN etching step.

The additional fraction of oxygen introduced by this alternative embodiment can be highly advantageous in at least two ways. First, since $TiO_2$ is so chemically inert, it adds to the durability of the local interconnect layer as an etch stop at contact hole locations. Second, the etching of the TiN layer becomes simpler: a high fraction of oxygen in the layer under the hardmask makes it possible to wet etch the TiN without undercutting the hardmask patterned interconnects too much. A sample wet etch for this purpose would be $NH_4OH+H_2O_2$ in water at room temperature, but many other wet etch chemistries could be used.

That is, titanium silicide typically gives a rough surface, so it is a pleasant surprise that the titanium under the oxide mask reacts with the oxide mask to form titanium oxides as a surface sealant. This surface $TiO_2$-rich layer avoids in-migration of etchants during a wet etch and thus permits the simple wet etch process described.

In an alternative version of this embodiment, the plasma oxide hardmask is stripped after the silicidation heating step (the 675° C. step in the example given) and before the annealing step (the 800° C. step in the example given). By ensuring that a nitrogen atmosphere is present during the high-temperature step, any possibility of silicon and dopant outdiffusion is suppressed, and the remaining metallic titanium which the oxide mask protected from the first heating step will substantially all be converted to nitrides, providing additional diffusion barrier advantages as described above. Another (less preferred) alternative way (for NMOS processes or some CMOS processes with two types of polysilicon) to convert the patterned titanium into a stable conductor is to perform the high-temperature anneal in an atmosphere which does not include nitrogen, so that silicon outdiffusion can convert the titanium metal in the local interconnect straps to titanium silicide.

Note that the oxide hardmask does not strictly have to be stripped at all—optionally it can be left in place through the whole remainder of the process.

A very important advantage of this embodiment is that no TiN etch is required—instead the TiN is simply dipped out using a standard clean-up solution. Thus this embodiment may be the most suitable of all for transfer into a manufacturing environment.

Another advantage of this embodiment is that it is very scalable, since the geometry-limiting step is simply an oxide etch.

After the TiN layer has been patterned as desired, a second annealing step is preferably used to lower the sheet resistance of the silicide layers to one $\Omega/\square$ or less. This second heat treatment step is preferably performed at 800 degrees C. for 30 minutes in an argon atmosphere at atmospheric pressure, but these parameters may be varied. For example, the annealing temperature could be in the range of 750 degrees to 875 degrees, or even wider, and the other processing parameters of this step can also be widely varied.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning, and may be disposed of in the later anneal.

After the final anneal which lowers the sheet resistance of the silicide has been performed, processing then proceeds in conventional fashion. For example, an interlevel dielectric could now be deposited, such as 1000 Å of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as $CF_4$ plus 5% $O_2$, are reasonably selective to TiN.

The polysilicon gate layer so frequently referred to in the present application does not have to be strictly polysilicon, but can be other materials which are substantially polycrystalline or amorphous and contain a large fraction of silicon. For example, deposited silicides or polysilicon/silicide sandwich structures could less preferably be substituted, and future sandwich structures which have analogous deposition and electrical properties in future processes to the place of polysilicon in present processes are intended to be comprehended also.

Similarly, the various gate dielectric and interlevel dielectric layers referred to do not have to be silicon dioxide, silicon nitride, and combinations thereof.

Similarly, the metal layer so frequently referred to as titanium does not have to be strictly pure titanium, but may instead be any one of a wide range of titanium alloys or pseudo-alloys, as long as their chemistry is dominated by titanium; Ti:V and Ti:Al alloys are certainly included here, and other intermetallic compositions such as Ti:Y or Ti:W may also be usable.

It is possible that the teachings of the present invention can be extended to metals other than titanium. In general, any metal which
1. forms a conductive silicide.
2. will not allow silicon diffusion (at temperatures suitable for silicide formation) if the metal is passivated with oxygen, and
3. can reduce silicon oxides (at temperatures suitable for silicide formation), is a candidate for use of the present invention. Although titanium is the only metal so far known to optimally meet these requirements, and the present invention does give tremendous advantages when used with titanium (or titanium alloys), the teachings of the present invention could be applied to other suitable metals.

In addition, it may also be possible to adapt some of the teachings of the present invention to other "direct-react" processes. That is, other processes where a cladding process is performed by a blanket reaction which forms conductive cladding wherever certain materials are exposed, and provides a useful local interconnect material in other locations, may be adaptable to obtain some of the advantages of the present invention. Some candidates for such adaptation are: deposition and reaction of another refractory metal, (such as tungsten) to form silicides over exposed silicon and leave conductive metal (or a conductive compound, such as a nitride or partially oxidized reaction product) elsewhere. Similarly, it may alternatively be possible to use a gas phase source (such as halides or organometallic compounds) in place of the solid titanium layer used in the preferred embodiment. However, as discussed above, the principal preferred embodiments have tremendous proven advantages, and these modifications are much more conjectural.

As will be appreciated by those skilled in the art, the present invention can be widely modified and varied, and its scope is not limited except as specified in the allowed claims.

What is claimed is:

1. A process for fabricating integrated circuits, comprising the steps of:
   (a) providing a substrate having monocrystalline semiconductor portions at least some surface portions thereof, said semiconductor consisting predominantly of silicon:
   (b) providing device isolation areas in a predetermined pattern to define separate moat regions in predetermined locations of said monocrystalline semiconductor;
   (c) fabricating a first plurality of insulated gate field effect transistors in predetermined locations in said moat regions, gates of said first insulated gate field effect transistors being formed by portions of a first patterned thin film conductive layer:
   (d) providing a thin film insulator over at least some parts of said first patterned thin film conductive layer, and also providing a thin film insulator over predetermined locations of a second plurality of insulated gate field effect transistors in respective ones of said moat regions:

(e) depositing a metal consisting substantially of titanium overall;

(f) heating said substrate and said metal in a nitrogen-bearing atmosphere, so that said metal reacts with exposed portions of said substrate to form titanium silicides, and other portions of said metal also react with said nitrogen atmosphere to form a layer having a large fraction of titanium nitride at the surface thereof; and (g) etching predetermined locations of said titanium nitride layer to provide local interconnection in a predetermined pattern, while also leaving portions of said titanium nitride layer in place over at least some locations of said thin film insulator over said second transistor locations to define gates of said second transistors.

2. The process of claim 1, wherein said portions of said thin film insulator over said second transistor locations have an equivalent thickness greater than that of 300 Å of silicon dioxide.

3. The process of claim 1, wherein said thin film insulator over said second transistor locations consists essentially of a combination of silicon dioxide and silicon nitride.

4. The process of claim 3, wherein said thin film insulator over said second transistor locations comprises a layer of silicon nitride over a layer of silicon dioxide.

5. The process of claim 1, wherein said thin film insulator over said second transistor locations comprises a layer of silicon nitride over a layer of grown silicon dioxide.

6. The process of claim 1, wherein said thin film insulator is in place over some but not all parts of said first patterned thin film conductive layer prior to said step of depositing metal.

7. The process of claim 1,
wherein said thin film insulator is in place over some but not all parts of said first patterned thin film conductive layer prior to said step of depositing metal.
and wherein said first patterned thin film conductive layer consists of at least 70% atomic of silicon.
whereby some portions of said parts of said first patterned thin film conductive layer react to form silicides during said step of heating in a nitrogen-bearing atmosphere.

8. The process of claim 1, further comprising the additional step, subsequent to said siliciding step (e), of
(g) annealing said titanium silicide regions to lower their resistivity.

9. The process of claim 8, wherein said heating step (e) is performed at a temperature in the range of 500 to 750 degrees C., and said subsequent silicide annealing step (g) is performed at a higher temperature in the range of 700 to 875 degrees C.

10. The process of claim 1, wherein said titanium metal is applied to a thickness of less than 2000 Ångstroms.

11. The process of claim 1,
(c) wherein said substrate comprises both PMOS moat regions comprising p+ source/drain regions therein and NMOS moat regions comprising n+ source/drain regions therein,
(f) and wherein said titanium nitride layer is patterned to provide local connections from predetermined ones of said p+ source/drain regions to predetermined ones of said n+ source/drain regions.

12. The process of claim 11,
(c) wherein said first conductive layer comprises more than 60% atomic of silicon,
(f) and wherein said titanium nitride layer is patterned to provide connections from predetermined ones of said gate regions to predetermined ones of said source/drain regions.

13. The process of claim 11,
(c) wherein said insulated gate field effect transistors comprise insulated gate regions which are more than 60% atomic of silicon,
(f) and wherein said titanium nitride layer is patterned to provide connections from predetermined ones of said gate regions to predetermined ones of said p+ source/drain regions and also to predetermined ones of said n+ source/drain regions.

14. The process of claim 1,
(f) wherein said titanium nitride layer is patterned to leave said titanium nitride in place at predetermined contact hole locations, and further comprising the subsequent steps of:
(h) depositing an interlevel dielectric over said field effect transistors;
(i) cutting contact holes through said interlevel dielectric at predetermined contact hole locations to expose said titanium nitride at bottoms of ones of said contact holes; and
(j) providing a patterned metal layer to make contact to said respective titanium nitride layers at bottoms of said contact holes and to configure a predetermined interconnection.

15. The process of claim 11,
(f) wherein said titanium nitride layer is patterned to leave said titanium nitride in place at predetermined contact hole locations and also on at least some upper surface portions of said first conductive layer, and further comprising the subsequent steps of:
(b) depositing an interlevel dielectric over said field effect transistors;
(c) cutting contact holes through said interlevel dielectric at predetermined contact hole locations to expose said titanium nitride at bottoms of ones of said contact holes; and
(d) providing a patterned metal layer to make contact to said respective titanium nitride layers at bottoms of said contact holes and to configure a predetermined interconnection.

16. The process of claim 1, wherein said step (e) of depositing a metal deposits a metal comprising 30% atomic or more of titanium overall.

17. The process of claim 1, wherein said step (e) of depositing a metal deposits a metal consisting essentially of titanium.

* * * * *